(12) United States Patent
Hook et al.

(10) Patent No.: US 6,489,223 B1
(45) Date of Patent: Dec. 3, 2002

(54) ANGLED IMPLANT PROCESS

(75) Inventors: Terence B. Hook, Jericho, VT (US); Randy W. Mann, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/898,949

(22) Filed: Jul. 3, 2001

(51) Int. Cl.[7] .............................. H01L 21/425
(52) U.S. Cl. ..................... 438/524; 438/302; 438/525
(58) Field of Search ................... 438/286, 302, 438/298, 305, 525, 585; 257/344, 316, 324, 335

(56) References Cited

U.S. PATENT DOCUMENTS

| | | | |
|---|---|---|---|
| 4,466,178 A | 8/1984 | Soclof | 29/576 B |
| 5,155,369 A | 10/1992 | Current | 250/492.2 |
| 5,240,874 A | 8/1993 | Roberts | |
| 5,355,006 A | 10/1994 | Iguchi | 257/296 |
| 5,376,566 A | 12/1994 | Gonzalez | |
| 5,424,229 A | 6/1995 | Oyamatsu | |
| 5,439,835 A | 8/1995 | Gonzalez | |
| 5,504,358 A | 4/1996 | Hong | 257/315 |
| 5,518,942 A | 5/1996 | Shrivastava | |
| 5,705,410 A | 1/1998 | Guegan | |
| 5,783,457 A | 7/1998 | Hsu | |
| 5,888,887 A | 3/1999 | Li | 438/525 |
| 5,915,195 A | 6/1999 | Fulford | 438/524 |
| 5,920,776 A | 7/1999 | Fratin | 438/257 |
| 5,943,576 A | 8/1999 | Kapoor | 438/302 |
| 5,960,291 A | * 9/1999 | Krivokapic | 438/286 |
| 5,970,353 A | 10/1999 | Sultan | 438/302 |
| 5,972,745 A | 10/1999 | Kalter | 438/220 |
| 6,008,094 A | * 12/1999 | Krivokapic | 438/286 |
| 6,020,244 A | * 2/2000 | Thompson et al. | 438/302 |
| 6,030,871 A | 2/2000 | Eitan | 438/276 |
| 6,083,794 A | 7/2000 | Hook | 438/286 |
| 6,107,129 A | 8/2000 | Gardner | 438/230 |
| 6,121,096 A | 9/2000 | Hopper | 438/290 |
| 6,159,790 A | 12/2000 | Gonzalez | 438/253 |
| 6,168,637 B1 | 1/2001 | Randolph | 29/25.01 |
| 6,190,980 B1 | 2/2001 | Yu | 438/302 |
| 6,200,863 B1 | 3/2001 | Xiang | 438/286 |
| 6,218,250 B1 | 4/2001 | Hause | 438/302 |

* cited by examiner

*Primary Examiner*—David Nelms
*Assistant Examiner*—Dung Anh Le
(74) *Attorney, Agent, or Firm*—Anthony J. Canale; James M. Leas; Robert A. Walsh (57) ABSTRACT

Different symmetrical and asymmetrical devices are formed on the same chip using non-critical block masks and angled implants. A barrier is selectively formed adjacent one side of a structure and this barrier blocks dopant implanted at an angle toward the structure. Other structures have no barrier or have two barriers. Source and drain engineering can be performed for LDD, halo, and other desired implants.

18 Claims, 6 Drawing Sheets

ANGLED IMPLANT PROCESS

FIELD OF THE INVENTION

This invention relates to angled ion implants. More particularly, it relates to a method of producing a symmetrical and an asymmetrical semiconductor device using angled ion implantation.

BACKGROUND OF THE INVENTION

Semiconductor devices, such as metal oxide semiconductor field effect transistors (MOSFETs), produced with angled ion implantation techniques are often constructed symmetrically. This allows great flexibility in the layout of multiple devices as the source and drain are interchangeable (and both sides of the gate are consequently referred to simply as the "source/drain").

For some applications, this type of device symmetry is highly desirable or essential. Devices produced by angled ion implantation are generally made symmetric by rotating the semiconductor device to allow the angled implant beam to implant from all sides of the gate. This results in a series of symmetrical implants and a symmetrical device.

High voltage devices have required a graded lightly doped drain (LDD) implant while low voltage devices favor an abrupt implant, such as an extension type implant, as is well known in the art. Low voltage devices also often have a halo or a more heavily doped halo than high voltage devices. Such high and low voltage devices are frequently fabricated on the same chip. They generally have different gate dielectric thicknesses, channel lengths, and use separate masking steps and implants for the source/drain design.

For other applications, performance can be improved if the semiconductor device is constructed asymmetrically. For example, for MOSFETs having an LDD region and a halo region, the LDD is desirable exclusively on the drain side and the halo is desirable exclusively on the source side of the gate.

The addition of an LDD region degrades device performance because it increases series resistance and overlap capacitance. Since the lightly doped LDD region is strictly required only on the drain side of the device to mitigate hot carrier degradation, the LDD on the source side of a symmetrical device adds series resistance and capacitance with no additional benefit. Device performance can be improved if the LDD implant could be blocked from the source side thereby making an asymmetrical device. Furthermore, where a particular device is never subjected to high voltages, blocking the LDD implant from both sides may also be advantageous.

However, a very accurately-aligned critical mask capable of blocking the implant beam from the source side, but not blocking it from the drain side, has been needed to provide the desired asymmetrical device. To block the implant on one side, but not on the other side of the gate requires aligning the critical mask to within the width of the gate. This has required alignment tolerance within one half the width of the gate. Obtaining such critical alignment is an expensive and error-prone procedure.

Alternatively, the LDD implant may be produced through a single ion implant beam which places the implant under one side of the gate. Thus, the desired LDD is formed when the appropriate ion implant beam is directed at an angle towards the drain side of the gate. To produce many asymmetrical devices on the same semiconductor substrate requires that all of the devices be oriented in the same direction so that a single ion implant step can produce all of the LDD regions desired on the same side of the gate while avoiding implant on the opposite side.

It can be seen that controlled device asymmetry is possible if all the devices are oriented in the same direction and the opposite direction rotation is omitted. However, orienting all of the devices in the same direction significantly limits layout flexibility.

The same problem is encountered when constructing a halo implant only on the source side of the device. If the halo implant is placed on the drain side, it increases junction capacitance and peak electric field. Achieving halo implants only on the source side has heretofore required the same choice between an expensive critical mask with alignment comparable to half the gate width or an angle implant with uniform device orientation such that all of the devices have the source on the same side.

Therefore, an improved process to provide implants is needed and this solution is provided by the following invention.

SUMMARY OF THE INVENTION

It is therefore an object of the present invention to selectively provide different implants on different devices or on different sides of the same device on a semiconductor wafer.

It is a further object of the present invention to form both symmetrical and asymmetrical semiconductor devices on a semiconductor wafer.

It is a feature of the present invention to use a single non-critical mask to selectively form barriers adjacent semiconductor devices or adjacent one side of certain devices to shadow ion implant beams.

It is an advantage of the present invention that the location of ion implant can be controlled without adding critical masks or reducing layout flexibility.

It is an advantage of the present invention to provide asymmetrical devices without added critical masks or reducing layout flexibility.

These and other objects, features, and advantages of the invention are accomplished by a method for selectively blocking angled ion implants on a semiconductor substrate. The method includes providing a semiconductor substrate having a surface. A first structure and a second structure are formed on the surface of the substrate. A first barrier is selectively formed adjacent a first side of the first structure. A dopant is implanted at an angle, however the barrier shadows the dopant from a portion of the first structure and no barrier shadows dopant from a corresponding portion of the second structure.

The present invention also includes symmetrical and asymmetrical semiconductor devices on the same wafer. Most typically, this will include a field effect transistor, having an LDD on the drain side of the gate, but not on the source side of the gate, or having a halo on the source side of the gate, but not on the drain side of the gate, or both; or a second set of devices having no halo implant in the source/drain, or a set of devices having no LDD implant in the source/drain.

Although the present invention may find application in various types of ion implanted semiconductor devices, the invention will be described here in connection with its application in MOSFET technology in which the structures on the semiconductor surface are the gates of MOSFETs.

BRIEF DESCRIPTION OF THE DRAWINGS

The foregoing and other objects, features, and advantages of the invention will be apparent from the following detailed description of the invention, as illustrated in the accompanying drawings, in which.

DESCRIPTION OF THE PREFERRED EMBODIMENT(S)

The present inventors recognized that providing a barrier next to some devices but not others allowed both symmetrical and asymmetrical devices to be formed at the same time without critical masks and without changing the way a chip is laid out. They also big recognized that providing barriers on both sides of some devices allowed four kinds of symmetrical devices to be formed at the same time.

Commonly assigned U.S. Pat. No. 6,083,794 by Hook et al., teaches a barrier on one side of a gate to block angle implant from that side, while implant angled toward the other side reaches the other side of the gate, thereby forming an asymmetrical semiconductor device. The present invention extends this idea to provide different devices on a single chip without the need for any more critical masks.

Semiconductor surface 10 has structures, such as gates 12a, 12b, 12c of field effect transistors 13a, 13b, 13c having sides 14 and 16 as shown in FIGS. 1a–1c and 2a–2c. Additional transistors (not shown) will usually be positioned in an array around transistors 13a, 13b, 13c. In most implementations, the additional transistors will be laid out in four mirror image orthogonal orientations. Two or more of transistors 13a, 13b, 13c can be formed on surface 10 of the same chip using the same non-critical mask and the same angled implant, as further described herein below. They are shown in separate figures for clarity but they can all be on the same surface.

Figure 1A:
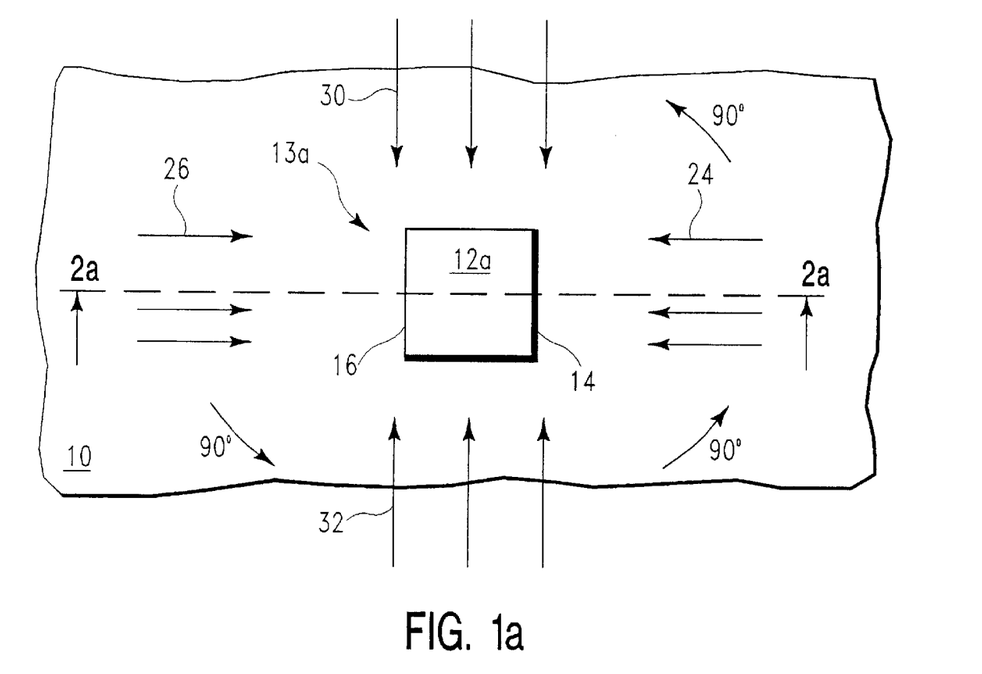
FIGS. 1a–1c are top views of semiconductor devices being implanted in accordance with the present invention.
Figure 1B:
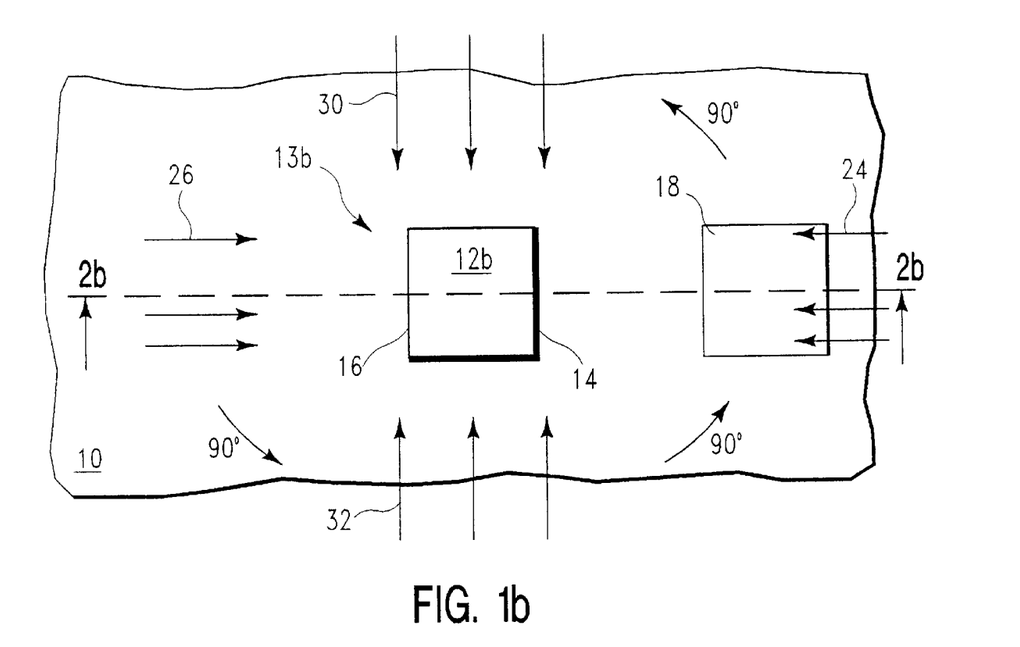
Figure 1C:
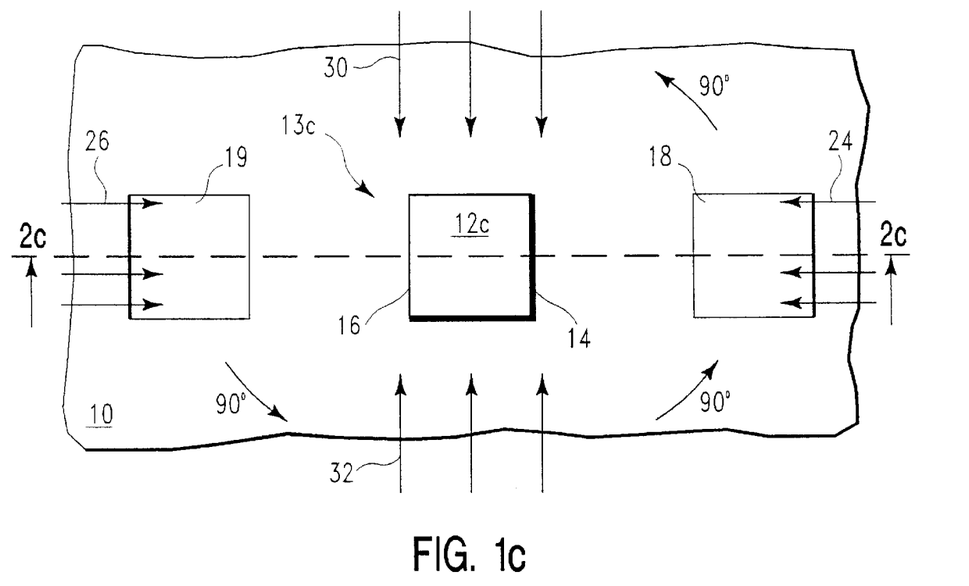

Four separate 90° rotations provide angled ion implant beams 24, 26, 30 and 32 as shown in FIGS. 1a–1c. Generally, semiconductor surface 10 will be rotated 90° between each implant. Implants 30, 32 arriving from directions parallel to sides 14 and 16 of gates 12a, 12b, 12c add negligibly to the source/drain doping but will not penetrate below corner 22 and corner 28, and will not create LDD or halo structures. Implants 30, 32 may be used, however, to form LDD or halo structures on other devices on the same semiconductor surface 10 having an orientation at 90° or 270° to the devices shown in FIGS. 1a–c.

Figure 2A:
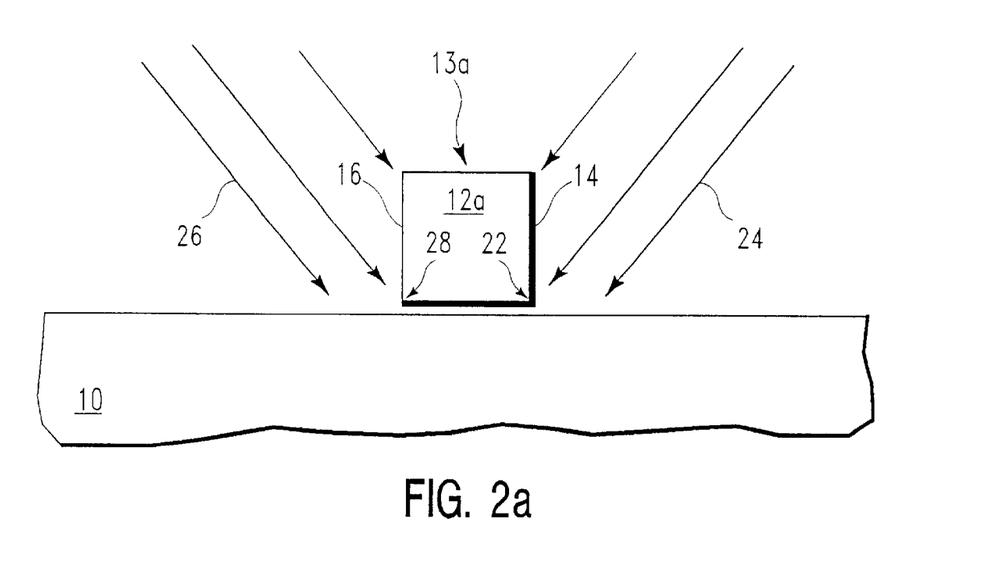
FIGS. 2a–2c are cross-sectional views of the semiconductor devices taken along the line 2—2 shown in FIGS. 1a–1c.
Figure 2B:
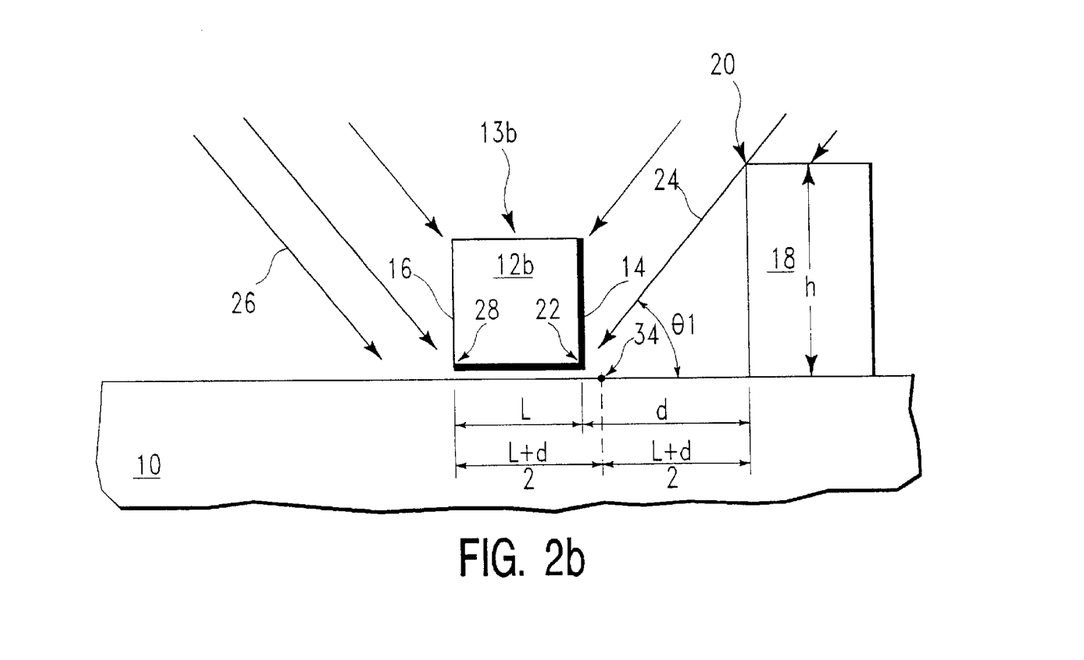
Figure 2C:
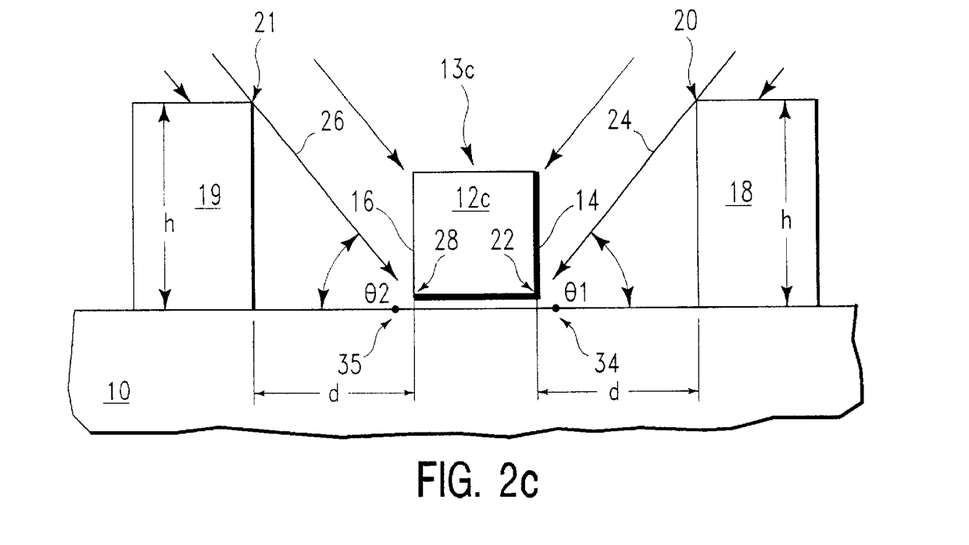

Three devices are compared in FIGS. 1a–c and in FIGS. 2a–c. Symmetrical device 13a receiving all implants 24, 26, 30, 32 on both sides 14, 16 is shown in FIGS. 1a, 2a. Barrier 18, of an ion absorbing material, such as photoresist, having height h is positioned distance d away from side 14 of gate 12b as shown in FIG. 2b to provide asymmetrical device 13b having ion implant 26 on side 16 but no ion implant 24 on side 14. Barrier 19 having height h is positioned distance d away from side 16 as shown in FIG. 2c to provide another symmetrical device 13c where implants 24, 26 are all blocked from both sides 14, 16. The effects of ion implantation in semiconductor surface 10 and the resulting semiconductor devices produced by the present invention are shown in corresponding FIGS. 3a, 3c. FIGS. 3b, 3d, and 3e show other semiconductor devices that can similarly be formed using the process of the present invention or two such processes. The semiconductor devices all include source/drain regions 54, 56 or drain region 36, source region 38, and shallow trench isolation (STI) regions 40 and 42 surrounding the device.

Without any barrier, when ion implant beams 24 and 26 are directed to sides 14 and 16, respectively, the desired ion implants will occur under right lower corner 22 and left lower corner 28 of gate 12a of FET 13a as shown in FIG. 2a. These desired ion implants produce LDD regions 44 and 60 in the source/drain regions 54, 56 of gate 12a of FIG. 3a. Ion implant beams 30 and 32 have no effect since they are not oriented in a proper direction to implant underneath either corner 22 or corner 28.

Figure 3A:
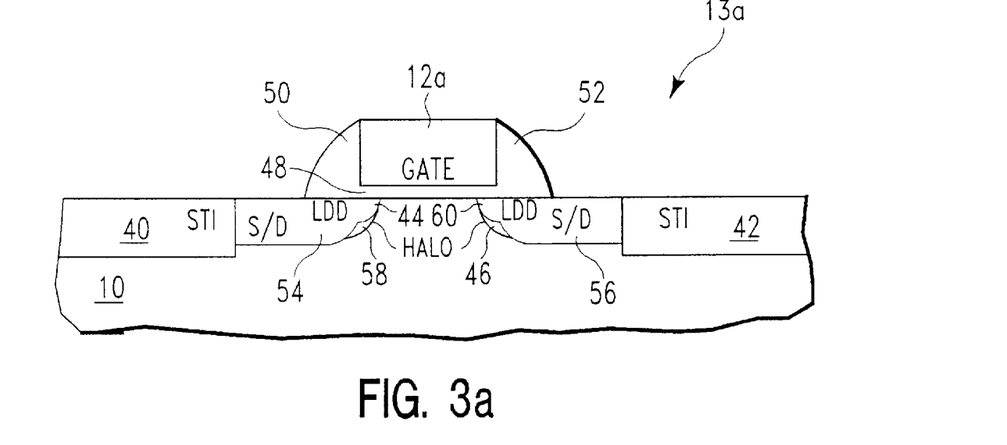
FIGS. 3a, 3c are cross-sectional views of the semiconductor devices of FIGS. 1a, 1c and 2a, 2c after implant is complete.
Figure 3B:
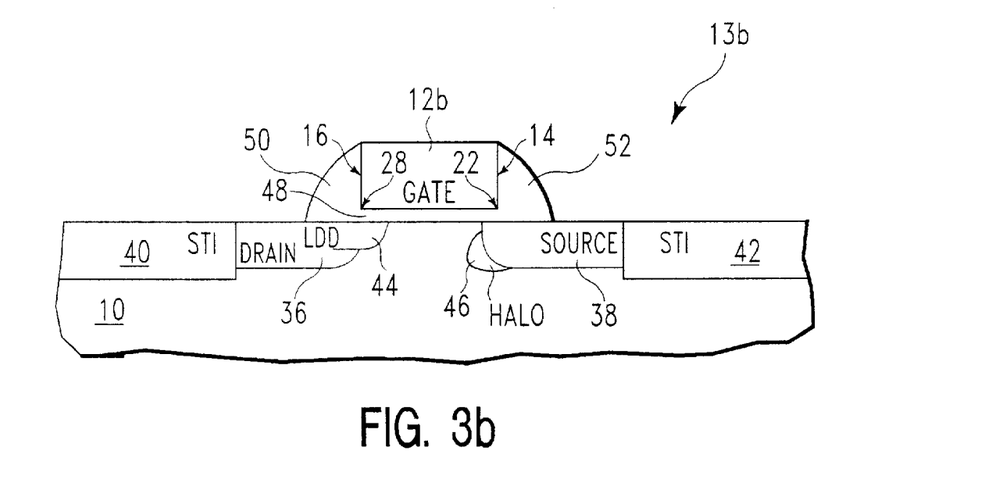
FIGS. 3b, 3d, and 3e are cross-sectional views of other semiconductor devices that can be made with the barrier and angle implant of the present invention after the implant is complete.

Halo regions 46 and 58 are similarly implanted with angle implant beams on both source/drain sides of gate 12a with no barrier present as shown in FIG. 3a.

The halo implant is required only on the shorter channel-length devices and it may be safely omitted on long-channel devices. This is desirable as the device drain resistance may be improved by eliminating the halo implant. By using the barriers and angle implants of the present invention short symmetrical devices with halo implant may be simultaneously created with long symmetrical devices without halo implant.

For many short-channel devices threshold voltage is determined primarily by the halo implant. Thus, by using the barriers and angle implants of the present invention, short symmetrical devices with different threshold voltages may be simultaneously created.

Barrier 18 of height h shown in FIG. 2b casts a shadow from upper corner 20 covering lower corner 22 of side 14 of gate 12b of FET 13b, when ion implant beam 24 is directed at side 14 at an angle θ1 measured relative to semiconductor surface 10. The maximum distance, d, that barrier 18 may be placed away from side 14 of gate 12b and still protect lower corner 22 from ion implant beam 24 is illustrated by FIG. 2b. If barrier 18 is placed any farther to the right, i.e. beyond maximum distance d, ion implant beam 24 will not be fully blocked. Generally, barrier 18 may be placed at any point between side 14 of gate 12b and maximum distance d. Barrier 18 may also extend on the upper surface of gate 12b between side 14 and side 16. Barrier 18 cannot be placed to the left of side 16 because in this position the barrier would block desired ion implant beam 26 directed toward side 16 for providing desired ion implant under left lower corner 28 of gate 12b. Thus, if gate 12b has a length L, barrier 18 has an acceptable range of positions equal to L+d.

If an additional implant at angle φ must be provided with barrier 18 in place to provide a dose along edge 14 then barrier 18 must be spaced from gate 12b to allow for that other implant. The mask edge must then be located between h/tan φ and h/tan θ1.

Barrier 18 will normally be placed somewhere near mid point 34 of this range of positions, as shown in FIG. 2b. The alignment error in positioning barrier 18 at mid point 34 may be as large as one half the sum of L plus d. The maximum distance d is given by the relationship of h divided by the tangent of angle θ1. By selecting angle θ1 and height h, the tolerance error for positioning the mask may be adjusted. The shallower the angle θ1 and the higher the height h of barrier 18, the greater the maximum distance d and the greater the tolerance of the position error in placing barrier 18.

Desired ion implant beam 26 produces LDD region 44 in drain region 36 of gate 12b shown in FIG. 3b. There is no corresponding LDD region underneath corner 22 because barrier 18 blocked ion implant beam 24. Ion implant beams 30 and 32 were not oriented in the proper direction to implant underneath either corner 22 or corner 28. Barrier 18 will block only one of the four beams, i.e. ion implant beam 24, so it can remain on semiconductor surface 10 during all four rotations of the implant process. If desired, LDD region 44 could be formed only under side 14, opposite to that shown in FIG. 3b, by constructing barrier 18 on the left side, i.e. on the drain side so that the shadow of barrier 18 would shield corner 28 of gate 12b from ion implant beam 26, but would not shield corner 22 of gate 12b from ion implant beam 24.

A halo region 46 found only on the source side and not on the drain side is also shown in FIG. 3b. This makes the device doubly asymmetric. Halo region 46 is formed by constructing a barrier on the left side, i.e. on the drain side so that the shadow of the barrier would shield corner 28 of gate 12b from halo ion implant beam 26, but would not shield corner 22 from halo ion implant beam 24.

If desired, halo region 46 could also be formed on the drain side by constructing a barrier, or by using the same barrier that was used to form LDD region 44, on the source side so that the shadow of the barrier would shield corner 22 from halo ion implant beam 24, but would not shield corner 28 from halo ion implant beam 26. In this way, both LDD region 44 and halo region 46 are on the drain side of gate 12b. Likewise, both LDD region 44 and halo region 46 can be formed on the source side of gate 12b by constructing a barrier on the drain side of gate 12b. In addition, if LDD region 44 is formed on the source side of gate 12b, halo region 46 could be formed on the drain side of gate 12b by constructing a barrier on the source side of gate 12b.

To form the doubly asymmetrical device described above where halo region 46 is opposite LDD region 44, two masking steps are needed to separately provide a barrier on one side of the gate for the LDD implant and then a barrier on the other side for the halo implant.

To provide a second symmetrical device, both sides 14 and 16 of gate 12c are shadowed at the same time as shown in FIG. 2c. Similar to FIG. 2b, a first barrier 18 of height h casts a shadow from its upper corner 20 which covers lower corner 22 on side 14 when ion implant beam 24 is directed at side 14 and has angle θ1 measured relative to semiconductor surface 10. In addition, barrier 19 of height h casts a shadow from its upper corner 21 which covers lower corner 28 on side 16 when ion implant beam 26 is directed at side 16 and has angle θ2 measured relative to semiconductor surface 10. Typically, the angles θ1 and θ2 of the ion implant beams are the same.

The same criteria described herein above for distance and height with respect to one barrier, also apply for two barriers. Generally, barriers 18, 19 are placed at any point between sides 14 and 16 of gate 12c and maximum distance d. Either one or both of the barriers may be placed extending onto the upper surface of gate 12c at any point between side 14 and side 16. In the case of one of the barriers placed on the upper surface of gate 12c, the barrier may extend beyond a side of gate 12c. For example, when barrier 18 is formed at distance d away from side 14 as shown in FIG. 2c, barrier 19 can be formed extending onto the upper surface of gate 12c and beyond side 14. Likewise, when barrier 19 is formed at distance d away from side 16, then barrier 18 can be formed extending onto the upper surface of gate 12c and beyond side 16. This allows for an even greater tolerance of the position error in placing the barriers. However, if a second implant is needed adjacent a side of the gate with barrier 18 or 19 in place, then overlap with the gate is not permitted.

Figure 3C:
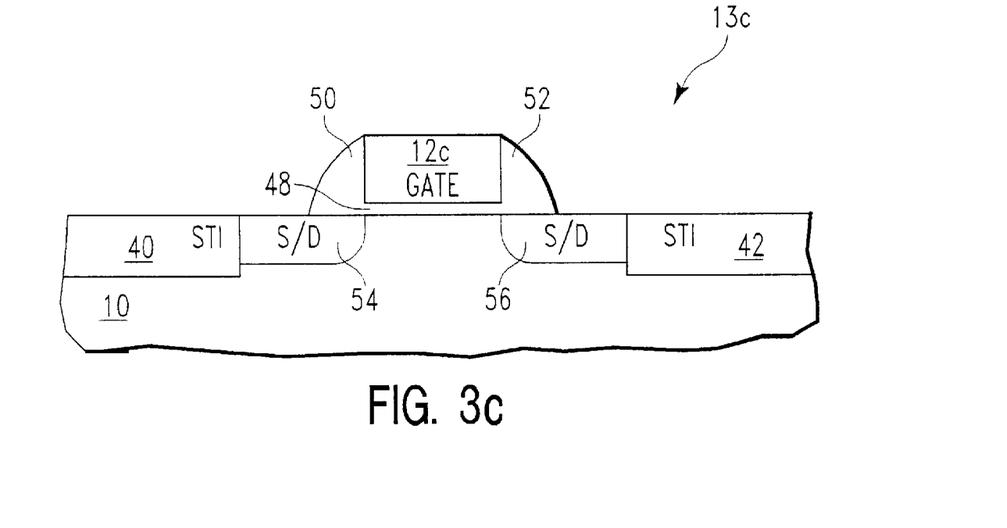
Figure 3D:
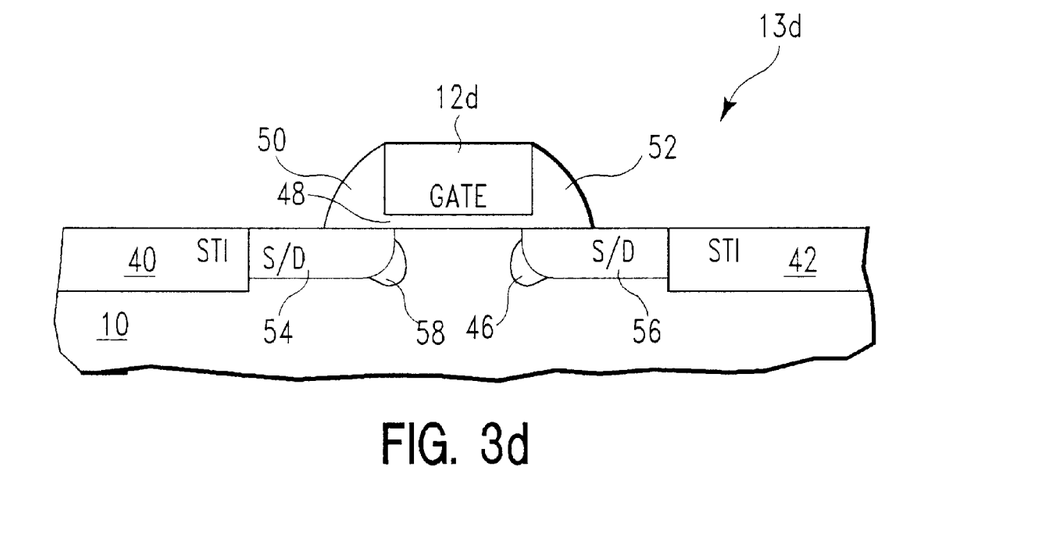
Figure 3E:
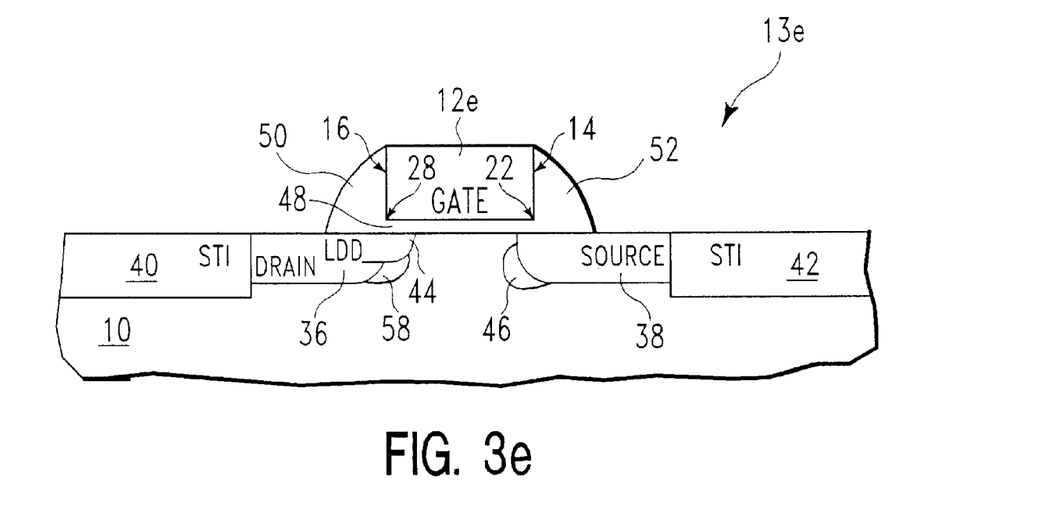

Source/drain regions 54, 56 of gate 12c shown in FIG. 3c are formed with vertical implants and have no LDD regions or halo regions underneath either corner 22 or corner 28 due to the presence of barrier 18 and barrier 19 blocking LDD and halo ion implant beams. Ion implant beams 30 and 32 are not oriented in the proper direction to implant underneath either corner 22 or corner 28. Because barrier 18 would block only one of the four beams (ion implant beam 24) and barrier 19 would block another of the four beams (ion implant beam 26), both barriers can remain on the semiconductor surface during all four rotations of the implant process.

Thus, two symmetrical devices can be formed on a chip with one process. The first has LDD and halo, and the second has neither. Other symmetrical and asymmetrical devices with LDD and halo can be formed as well, as shown in FIGS. 3d and 3e. A symmetrical device with no LDD and halo on both sides is formed on the same chip as one or more of the other devices, as shown in FIG. 3d. An asymmetrical device with LDD on the drain side and halo on both sides can also be formed, as shown in FIG. 3e.

The present invention is not limited to LDD and halo implants. Various dopant doses and implant energies can be used with barrier 18 and barrier 19 for providing source and drain engineering. Separate angle implants and barriers can be provided for each. Various symmetrical and asymmetrical devices can be formed on the chip by providing barriers on one side, both sides or no sides of particular devices.

Semiconductor devices having source/drain regions that include symmetrical LDD regions 44 and 60 can also be formed using spacers with vertical ion implant (not shown), as well known in the art. The halo can still be provided with angle implant. A vertical ion implant for the LDD is directed at an angle of about 90° with respect to semiconductor surface 10. Thus, the present invention can combine vertical implants and angled implants to provide different source and drain engineering structures.

Figure 4A:
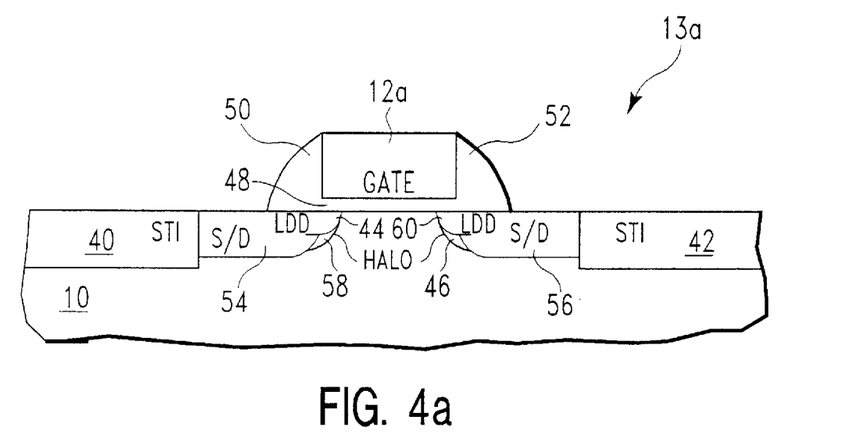
FIGS. 4a–4c are cross-sectional views of semiconductor devices made with a vertical LDD implant and an angled halo implant.

Source/drain regions 54, 56 of gate 12a shown in FIG. 4a include LDD implants from standard vertical implants before spacers 50, 52 are applied. Source/drain regions 54, 56 also include halo regions 46 and 58 formed by the method of the present invention as described with reference to FIGS. 1a and 2a. Halo regions 46 and 58 are formed underneath both corner 22 and corner 28 of gate 12a in FIG. 4a by having no barriers present to block ion implant beams 24 and 26. Thus, a symmetrical semiconductor device is formed with LDD and halo on both sides.

Figure 4B:
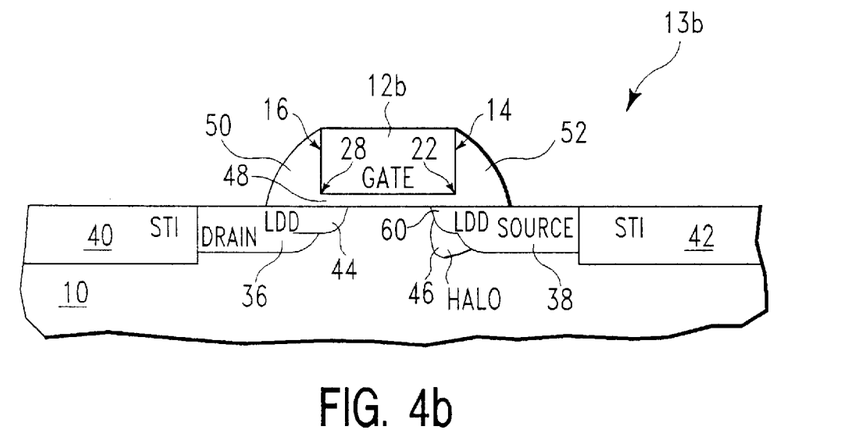

Source region 38 of gate 12b shown in FIG. 4b includes a halo region 46 formed underneath corner 22. A barrier is formed on drain side 36 to block ion implant beam 26 so a halo region is prevented from forming in drain region 36. No barrier is formed on the source side so ion implant beam 24 is able to implant underneath corner 22. The method to form halo region 46 in source region 38 is identical to that shown for the formation of LDD region 44 with reference to FIGS. 1*b* and 2*b*, except barrier 18 is on side 16 of gate 12*b*. Likewise, halo region 46 could be formed underneath corner 28 in FIG. 4*b* by constructing a barrier on the source side of gate 12*b* (as shown in FIGS. 1*b* and 2*b*) so that the shadow of the barrier would shield corner 22 from ion implant beam 24, but would not shield corner 28 from ion implant beam 26. In either case an asymmetrical semiconductor device is formed.

Figure 4C:
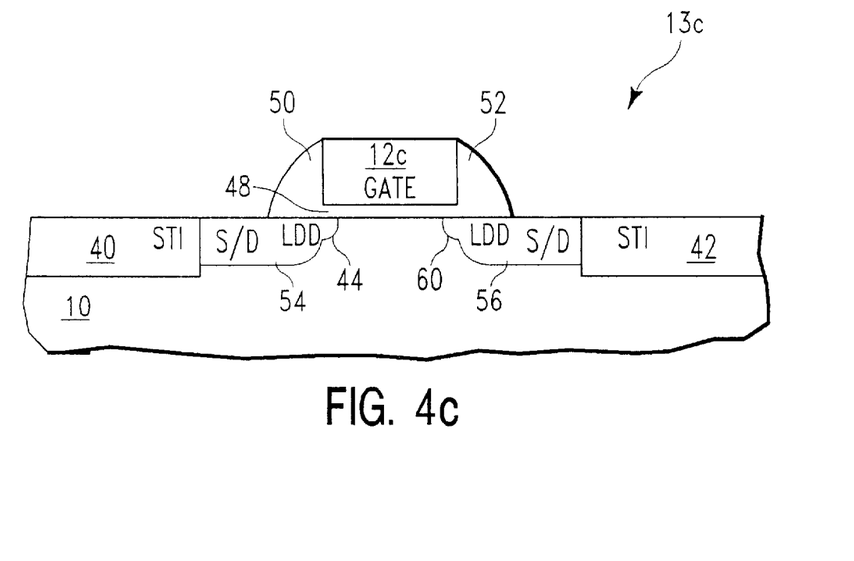

Source/drain regions 54, 56 of FIG. 4*c* show an absence of halo regions. As described with reference to FIGS. 1*c* and 2*c*, barrier 18 and barrier 19 are formed to block ion implant beams 24 and 26, respectively. In this way a symmetrical semiconductor device is formed without halos while other devices on the chip are formed without barriers and receive halo implants.

For all of the above cases the total halo or LDD dose may be modulated by providing a portion of the dose at an angle near 90° Barrier 18 will not shadow this implant. The remainder of the dose is provided at an angle at which barrier 18 is effective to shadow the implant. Thus, devices with greater or lesser doses of halo or LDD may be provided simultaneously with one masking step and two or more implant steps.

A combination of any two or more of the various types of semiconductor devices shown in FIGS. 3*a–e* or FIGS. 4*a–c* can be formed by the method of the present invention. That is, a non-critical masking step to provide a barrier adjacent a device is used to selectively control the location of implants into the various types of semiconductor devices being formed. The symmetrical semiconductor devices shown in FIGS. 3*a*, 3*c*, and 3*d* and the asymmetrical semiconductor devices shown in FIGS. 3*b* and 3*e* can be formed on the same chip semiconductor surface by the method of the present invention.

For other semiconductor devices at other orientations on the same surface, the barrier (or barriers) will simply be positioned relative to the other devices to shield the necessary side (or sides). Of course, all of these barriers will be laid down with a noncritical mask. For symmetrical devices with implants, no barrier will be laid down; for asymmetrical devices, one barrier will be laid down; and for devices where no implant is desired, two barriers will be laid down to shadow both sides of the gate.

Typically, the construction of multiple semiconductor devices includes numerous masking steps. The construction of photoresist barriers 18 and 19 may often be incorporated into one of these non-critical masking steps without requiring additional process steps to implement this invention. Either photoresist or hard mask can be used to form the barriers.

The invention is particularly well suited to making multiple symmetrical and asymmetrical devices on a single substrate at different orthogonal orientations using one or two non-critical masking steps to selectively control the location of an ion implant. The use of one non-critical masking step with angle implants allows for at least three different devices (2 symmetrical, 1 asymmetrical) to be formed, whereas the use of two non-critical masking steps with angle implants allows for at least nine different devices (4 symmetrical, 5 asymmetrical) to be formed. Thus, the present invention offers a greater flexibility in providing symmetrical and asymmetrical devices on a single substrate without requiring critical masks or restrictions in device layout.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of fabricating a semiconductor device, comprising the steps of:
   a) providing a semiconductor substrate comprising a surface;
   b) forming a first stricture and a second structure on said surface;
   c) selectively providing a first barrier adjacent a first side of said first structure; and
   d) implanting a dopant at an angle wherein said first barrier shadows implanted dopant solely from a portion of said semiconductor substrate between said first side of said first structure and said first barrier.

2. The method as recited in claim 1, further comprising the step of selectively providing a second barrier adjacent a second side of said first structure, wherein in said implanting a dopant at an angle step (d) said second barrier shadows implanted dopant from a portion of said semiconductor substrate between said second side of said first structure and said second barrier.

3. The method as recited in claim 2, wherein no barrier shadows implanted dopant from a corresponding portion of said second structure.

4. The method as recited in claim 2, further comprising a barrier shadowing implanted dopant from a portion of said semiconductor substrate between a second side of said second structure and said second barrier.

5. The method as recited in claim 2, wherein in said implanting step (d) said first structure is symmetric and said second structure is symmetric, wherein said first structure comprises an implant shadowed on two sides and said second structure receives said implant on two sides.

6. The method as recited in claim 1, wherein said implanting step (d) is for providing a halo implant, an extension implant, or an LDD implant.

7. The method as recited in claim 1, wherein in said implanting step (d) said first structure comprises a thicker dielectric or a longer channel or is used with a different applied voltage than said second structure.

8. The method as recited in claim 1, wherein said first structure that has said dopant blocked has a different threshold voltage than said second structure receiving said dopant.

9. The method as recited in claim 1, wherein said first structure comprises an FET.

10. The method as recited in claim 1, wherein providing step (c) comprises providing said first barrier of ion absorbing photoresist.

11. The method as recited in claim 10, wherein providing step (c) comprises exposing said photoresist with a non-critical block mask.

12. A method of fabricating a semiconductor device, comprising the steps of:
   a) providing a semiconductor substrate comprising a surface;
   b) forming a first structure and a second structure on said surface;
   c) selectively providing a first barrier adjacent a first side of said first structure;
   d) implanting a dopant at an angle wherein said barrier shadows implanted dopant from a portion of said first structure wherein no barrier shadows implanted dopant from a corresponding portion of said second structure;

e) removing the first barrier;

f) forming a new barrier adjacent a second side of said first structure; and g) implanting a dopant at an angle wherein said new barrier shadows implanted dopant from a portion of said first structure.

13. The method as recited in claim 12, wherein no barrier shadows implanted dopant from a corresponding portion of said second structure.

14. The method as recited in claim 12, further comprising the step of selectively providing a barrier adjacent a second side of said second structure, wherein in said implanting a dopant at an angle step (g) said barrier shadows implanted dopant from said second side of said second structure.

15. The method as recited in claim 12, wherein said implanting step (d) is for providing an LDD implant, and said implanting step (g) is for providing a halo implant.

16. The method as recited in claim 12, wherein said implanting step (g) comprises implanting at a first angle and then implanting at a second angle different from said first angle.

17. The method as recited in claim 16, wherein said first angle is approximately vertical to provide a portion of the implant to all devices and said second angle is sufficient so a portion is blocked by said first barrier.

18. The method as recited in claim 12, wherein in said implanting step (g) said first structure comprises a thicker dielectric or a longer channel or is used with a different applied voltage than said second structure.

\* \* \* \* \*